United States Patent [19]
Pandolfo

[11] Patent Number: 5,367,668
[45] Date of Patent: Nov. 22, 1994

[54] METHOD AND APPARATUS FOR FAULT-DETECTION

[75] Inventor: Michael A. Pandolfo, Worcester, Mass.

[73] Assignee: Stratus Computer, Inc., Mass.

[21] Appl. No.: 23,346

[22] Filed: Feb. 26, 1993

[51] Int. Cl.$^5$ .............................................. G06F 11/00
[52] U.S. Cl. ...................... 395/575; 371/68.3
[58] Field of Search .................. 395/575, 200, 325; 371/6, 16.1, 16.3, 25.1, 68.1, 68.3

[56] References Cited

U.S. PATENT DOCUMENTS

| | | | |
|---|---|---|---|
| 5,155,809 | 10/1992 | Baker et al. | 395/200 |
| 5,231,640 | 7/1993 | Hanson et al. | 371/68.3 |
| 5,263,034 | 11/1993 | Guenthner et al. | 371/68.3 |

*Primary Examiner*—Vincent P. Canney
*Attorney, Agent, or Firm*—Lahive & Cockfield

[57] ABSTRACT

An improved method for operating a digital data processing apparatus to provide for fault-tolerant actuation of a functional unit in response to an actuation request includes the steps of: providing the functional unit with a switching section that responds to application of plural switching signals for activating the functional unit; providing first and second processing elements, each normally responding to an actuation request for generating a first set of switching signals, the first set of switching signals including at least one, but not all, of the plural switching signals; outputting the first set of switching signals generated by the first processing element for application to the switching section; synchronizing the first and second processing elements by comparing, with the second processing element, the first set of switching signals generated thereby with those output by the first processing element; generating, after synchronization, with each of the first and second processing elements, a second set of switching signals, the second set of switching signals including at least one, but not all, of the plural switching signals, the first and second subsets of switching signals together making up the plural switching signals; and outputting the second set of switching signals generated by the second processing element for application to the switching section.

13 Claims, 6 Drawing Sheets

METHOD AND APPARATUS FOR FAULT-DETECTION

BACKGROUND OF THE INVENTION

This invention relates to digital data processing and, more particularly, to logic for detecting and preventing propagation of erroneous signals on digital data processing apparatus.

The necessity of checking the validity of signals transferred in digital data processing apparatus has long been appreciated. Since their advent, such apparatus have incorporated parity circuitry for verifying at least the form of signals transmitted within them. Though not capable of checking substantive content, this circuitry signals faults when transmitted data has an improper ratio of zero and one bits.

More recently computer systems have incorporated still better mechanisms for insuring the accuracy of transmitted data. For example, U.S. Pat. No. 4,750,177, assigned to the assignee hereof, discloses a computer system in which redundant functional units (e.g., partnered central processing units) synchronously transmit like data signals onto a common bus. By monitoring the bus, the units can determine whether they and their partners are in agreement and, if not, signal an appropriate fault. Similarly assigned U.S. Pat. No. 4,931,922 discloses an input/output controller that synchronizes signal transfers along a peripheral device bus by generating a bus strobe signal after successfully cross-comparing the output of partnered controller boards.

While the techniques described in the aforementioned patents have proven quite successful, they are typically adapted only for use in synchronous environments. There is accordingly a need for data and control signal verification in asynchronous environments.

Therefore, an object of this invention is to provide systems for digital data processing and, more particularly, for improved detection and prevention of propagation of erroneous data and control signals.

Another object is to provide such systems in a form adaptable to use in asynchronous environments.

Still another object is to provide such a mechanism for the verification of control signals used, e.g., to shut-down and restart computer systems.

SUMMARY OF THE INVENTION

The aforementioned and other objects are achieved by the invention which provides, in one aspect, a fault-tolerant method of activating a functional unit in response to a request therefor. The functional unit can be, for example, a digital data processor bus that transfers information signals. It can also be a central processing unit that responds to interrupts for carrying out designated operations, such as power-up, power-down, shut-down and halt-and-restart.

The improvement is characterized, in part, by equipping the functional unit with a switching section that responds to plural switching signals for activating the functional unit. Thus, in the example above, the digital data processor bus can be equipped with a pair of switches that must be closed in order to permit data to pass. Or, the central processing unit can be equipped with a set of interrupt lines, each gated by a pair of serial field effect transistors (FET's) that must be activated to apply the respective interrupt.

The method also contemplates providing first and second asynchronous processing elements, each of which normally responds to an actuation request by generating a first set of switching signals. This first set includes at least one, but not all, of the switching signals necessary to actuate the functional unit. In the examples, the first set may include switching signals for closing the first switch in the pair attached to the digital data processor bus or for actuating the first FET in the pair gating the interrupt lines.

The first and second processing elements are synchronized through use of the second processing element to compare the first set of switching signals generated by that processing element with those generated by said first processing element.

After synchronization, each of the processing elements generates a second set of switching signals. The second set includes at least one, but not all, of the switching signals necessary to actuate the functional unit. Together with the first set of switching signal, the second set comprises the full complement of switching signals necessary to actuate the functional unit. Thus, in the examples, the second set may include switching signals for closing the remaining switch in the pair attached to the digital data processor bus or for actuating the remaining FET in the pair gating the interrupt lines.

According to one aspect of the invention, the first set of switching signals generated by the first processing element are applied to the switching section, e.g., to commence the actuation process. The second set generated by the second processing element are applied to the switching section to complete that process.

According to further aspects of the invention, the improved method contemplates resynchronizing the processing elements by using the first processing element to compare the second set of switching signals generated by that processing element with those generated by the second processing element.

The invention contemplates, in still further aspects, signaling a fault during the synchronizing and resynchronizing steps if the compared switching signal sets "miscompare." For example, if the second processing element determines that the first set of switching signals generated by it are not equal to those generated by the first processing element, the second processing element can generate a fault signal. Likewise, the second processing element can generate a fault signal if it does not receive the first set switching signals from the first processing element within a designated time period, e.g., for example, if the processing elements are grossly out of synchronization or if the first processing element erroneously times-out.

In the event of miscomparison of the first set of switching signals, the method contemplates inhibiting application of at least the second set to the switching section.

In still another aspect, the invention contemplates providing, as the first and second processing elements, programmable logic elements, e.g., microprocessors. To facilitate synchronization of the processing elements, the invention thus contemplates carrying out the method by executing substantially identical sequences of instructions on both logic elements.

The programmable logic elements can be further equipped, with output latches that selectively disable the respective processing elements from applying the first and second switching signals to the switching element. Thus, the first processing element can include an output latch that is enabled to output the first set of switching signals to the switching element, while the second processing element's latch prevents it from doing so. Nevertheless, because these output latches share a common conductor set, the second processor can detect switching signals output by the first processor.

Conversely, the second processing element can include an output latch that is enabled to output the second set of switching signals to the switching element, while the first does not. Again, because the output latches share a common conductor set, the first processor can detect the second set of switching signals generated by the second processor.

In further aspects, the invention provides apparatus operating in accord with the methods described above.

The aforementioned and other aspects of the invention are evident in the drawings and in the description which follows.

BRIEF DESCRIPTION OF THE DRAWINGS

A fuller appreciation of the invention may be attained by reference to the attached drawings, in which.

DETAILED DESCRIPTION OF THE ILLUSTRATED EMBODIMENT

Figure 1:
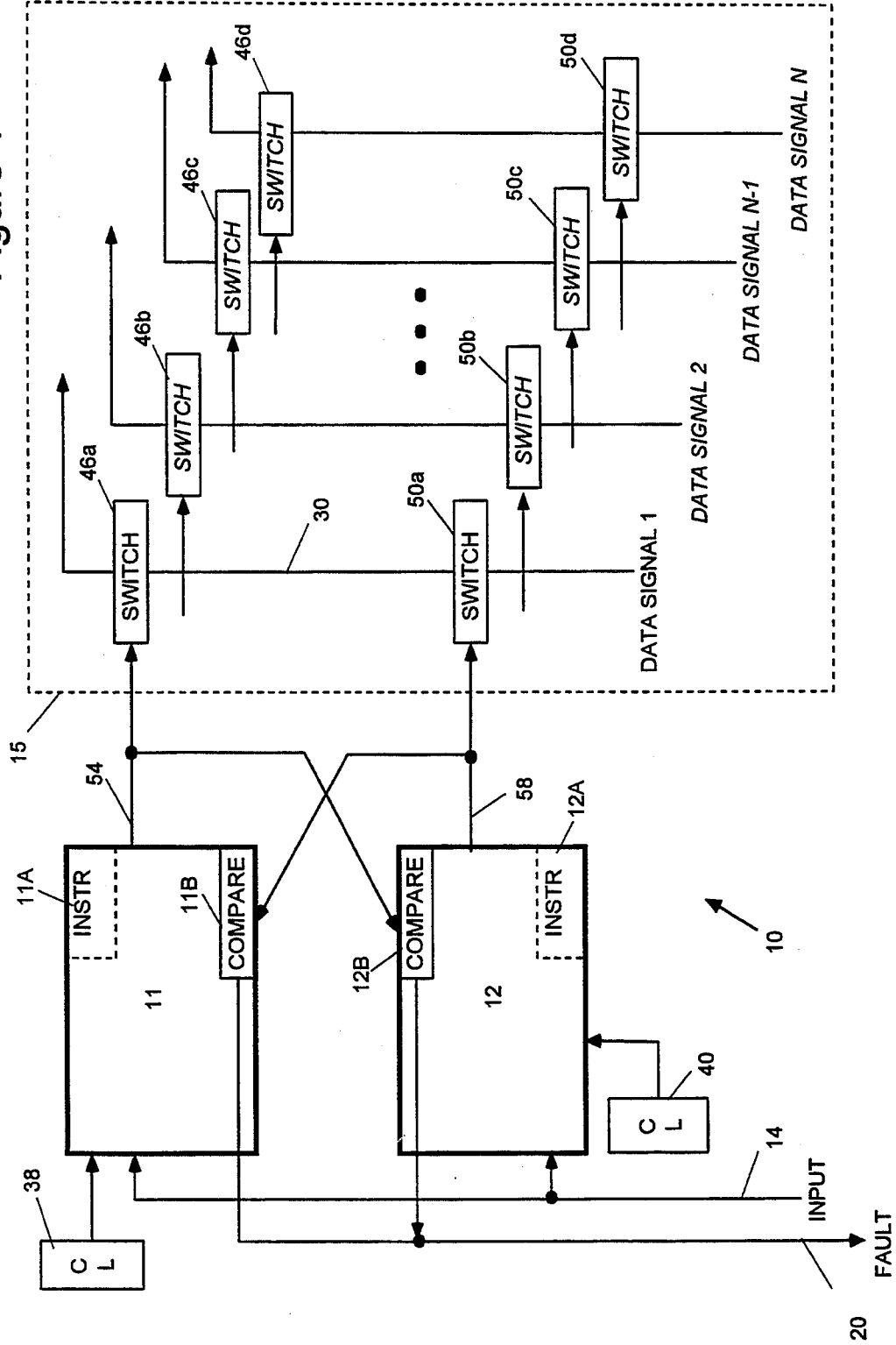
FIG. 1 depicts an apparatus operating according to a preferred practice of the invention with a dual switching structure for fault-tolerant control of data signals on a bus structure.

FIG. 1 depicts a fault-tolerant system 10 according to a preferred practice of the invention for actuating a functional unit 15 equipped with dual switch pairs 46a–46d and 50a–50d.

The illustrated system 10 has dual processors 11, 12, each having respective processing logic (not shown) operated in accord with the teachings herein via execution of instructions stored in instruction stores 11a and 11b. The processors 11, 12 further include check logic 11b, 12b, respectively, for comparing switching signals generated by the respective processing logic section with those output by the other section. Thus, check logic 11b compares switching signals generated by the local logic section with those output by the logic section of processor 12, while check logic 12b compares the switching signals of local logic section with those output by processor 11.

Illustrated processors 11, 12 are driven asynchronously. Thus, timing for processor 11 (and its respective circuitry, including processing logic 11a) is provided by clock 38, while timing for processor 12 is provided by clock 40.

Actuation request signals are supplied to the processors 11, 12 over line 14. These request signals may be generated by a system operator or remote device (not shown). Switching signals output by processing section 11 in response to those actuation request signals are routed internally to check logic 11b, and externally to switch 46a and check section 12b by lines 54. Likewise, switching signals output by processing section 12 in response to those same actuation requests are routed internally to check logic 12b, and externally to switch 50a and check section 11b by line 58.

Switches 46a, 50a operate under the respective control of processors 11, 12 to gate the flow of DATA SIGNAL 1 over conductor 30. Processors 11, 12 likewise control the routing of further data signals labeled DATA SIGNAL 2 . . . , DATA SIGNAL N-1 and DATA SIGNAL N, via switch pairs 46b/50b, 46c/50c and 46d/50d as illustrated.

Figure 2:
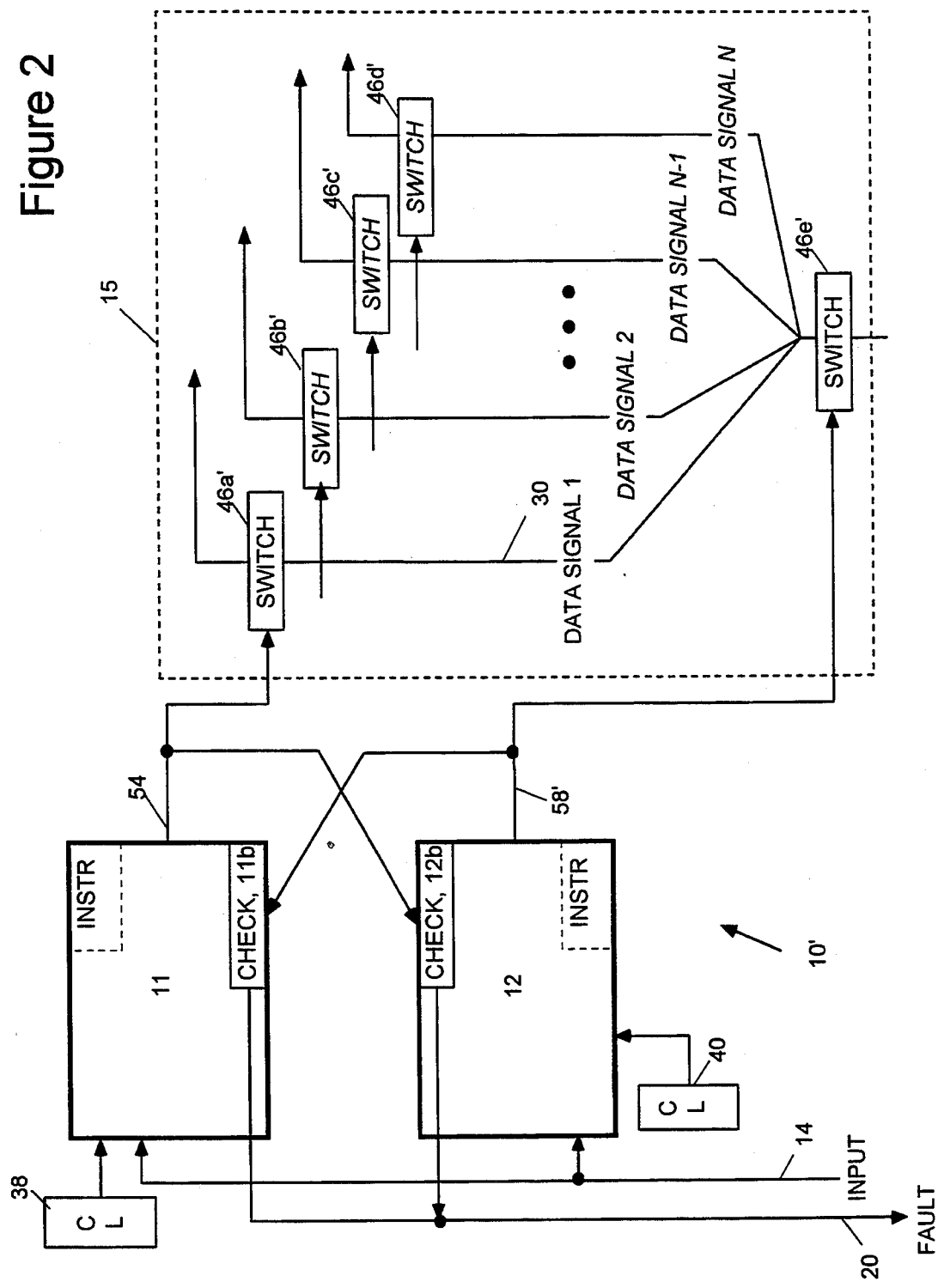
FIG. 2 depicts an apparatus operating according to a preferred practice of the invention with a modified switching structure for fault-tolerant control of data signals on a bus structure.

FIG. 2 depicts a fault-tolerant system 10' according to a preferred practice of the invention for actuating functional unit 15 equipped with a modified switch set 46a'–46e'. System 10' is generally constructed and operated similarly to system 10 described above in connection with FIG. 1. However, rather than closing a switch pair (e.g., switches 46a and 50a) in order to actuate the functional unit 15 (e.g., by permitting conduction of DATA SIGNAL 1), processor 11 closes a single switch (e.g., 46a') for each line (e.g., DATA SIGNAL 1) tip on which data is to be driven. Processor 12, on the other hand, drives a single switch 46e' common to all of the data lines. Those skilled in the art will appreciate that this preferred switching arrangement may be used where the same datum or data (e.g., a single bit) is to be routed along all data lines activated by processor 11.

Figure 3:
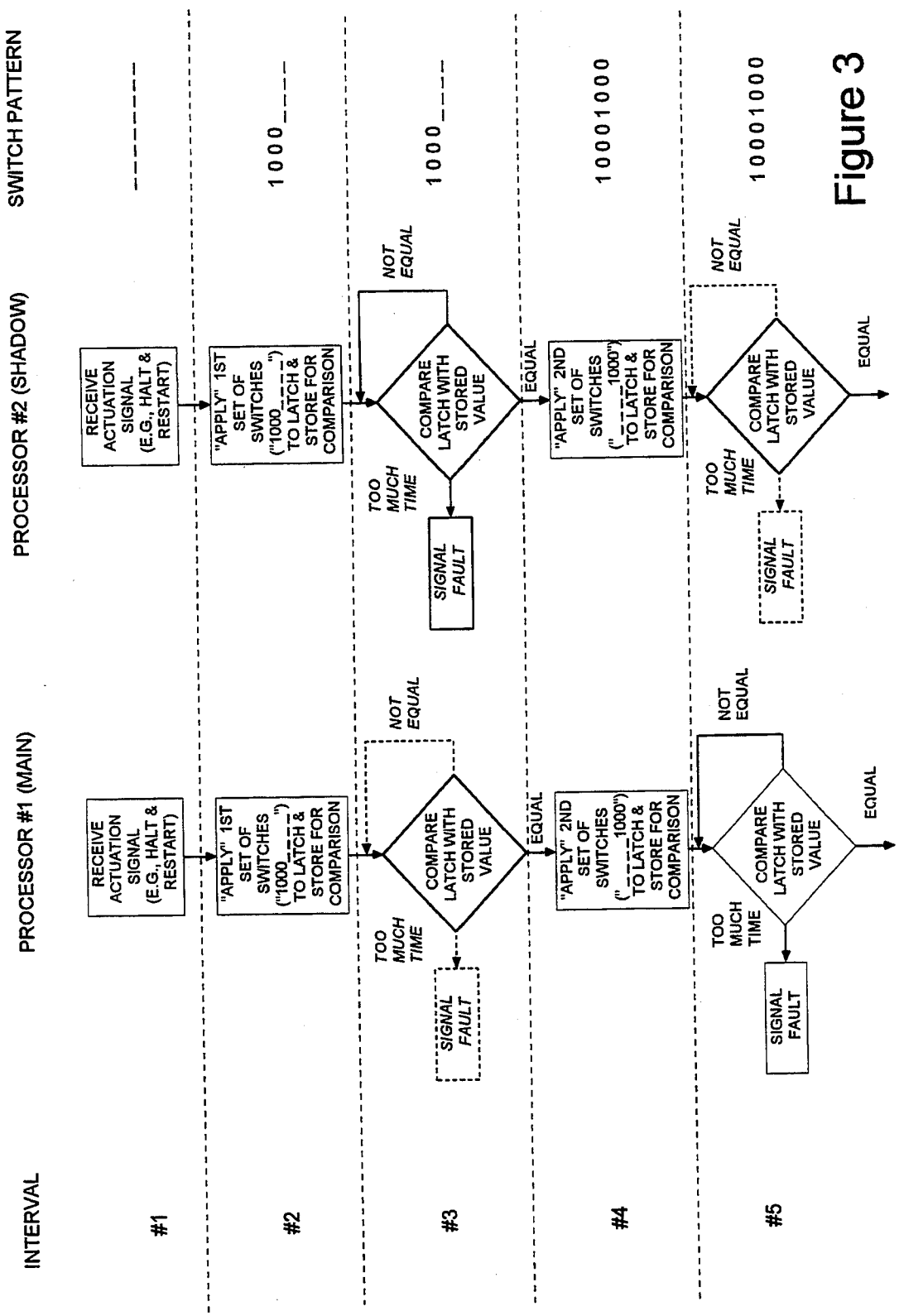
FIG. 3 depicts a sequence of operation of a preferred fault-tolerant control apparatus according to the invention.

The sequence of operation of control apparatus 10 (and, likewise control apparatus 10') is illustrated in FIG. 3. There it is shown that, in interval #1, "main" processor 11 and "shadow" processor 12 receive an actuation request, e.g., from an operator or remote device. This may represent, for example, a request to "halt & restart" a computing system of which system 10 forms part of the module control panel. In interval #1, processors 11, 12 also initialize the switching element by opening all switches 46a–46d, 50a–50d.

In interval #2, the main and shadow processors "apply" the first set of switching signals to their respective output latches for application to the corresponding switch array. In the illustration, those switching signals are represented by the binary string "1000" to designate which the switches in the upper switching array, i.e., switches 46a–46d, are to be closed. By way of example, the string "1000" indicates that the first switch (46a) is to be closed, while the second, third and fourth switches (46b–46d) are to remain open.

In a preferred embodiment, main processor 11 controls the upper switching array 46a–46d and hence, only it can modify the latch values corresponding to that array. Although the shadow processor 12 executes similar instructions that would otherwise cause it to modify the array, its respective is latch is disabled; hence, the shadow cannot modify the latch nor the upper switching array 46a–46d. In addition to modifying (or attempting to modify) the latch, in interval #2 the processors 11, 12 each store away for later use the value of the first set of switching signals.

In interval #3, the check logic 11b of main processor 11 compares the switching signals on its output latch with those that it previously stored away. Because processor 11 controls the latch, the comparison always succeeds as indicated by dashed lines in the decision block paths.

In interval #3, the check logic 12b of shadow processor 12 likewise compares the first set of switching signals on its output latch with those which it previously stored away. Because processor 11 controls the latch, this effects comparison of the switching signals generated internally by processor 12 with those generated by processor 11.

In the event the compared signals do not immediately match, processor 12 loops back for retry. This occurs repeatedly until the comparison is successful or until expiration of a designated time interval. In the event the comparison does not succeed within the designated interval, e.g., three clock cycles, the shadow processor 12 signals a fault, preventing further switches 46a–46d, 50a–50d from being closed.

If the shadow processor's 12 comparison does succeed, the process continues with illustrated interval #4, in which processors 11 and 12 generate and "apply" to their respective latches the second set of switching signals corresponding to the original actuation request. For a switching array 46a 46d, 50a–50d such as that shown in FIG. 1, the second set of switching signals is identical to the first set. For a preferred array of the type shown in FIG. 2, the second set may be a single bit-wide signal for activating a common switch (see, e.g., element 46e' of FIG. 2) for those lines actuated in interval #2.

Converse to the discussion above, shadow processor 12 controls the lower switching array 50a–50d and hence, only it can modify the latch values corresponding to that array. Presuming that it has correctly determined the second set of switching signals, upon applying those signals to the latch, interval #4 the shadow processor 12 effects closure of the appropriate switch pairs (e.g., 46a/50a) and, hence, actuates the functional unit 15. More particularly, with reference to the unit 15 shown in FIG. 1, the shadow processor 12 permits conduction of DATA SIGNAL 1 on the data bus.

In interval #4, main processor 11 executes instructions that would otherwise cause it to modify the lower switching array 50a–50d. However, because its respective is latch is disabled, cannot modify the lower switching array.

In interval #5, the check logic 12b of shadow processor 12 compares the switching signals on the output latch with those which it previously stored away. Because processor 12 controls the latch for the lower array, the comparison always succeeds.

The check logic 11b of main processor 11 likewise compares the first set of switching signals on the output latch with those which it previously stored away. Because processor 12 controls the latch, this effects comparison of the second set of switching signals generated internally by processor 11 with those generated by processor 12.

As above, in the event the compared signals do not immediately match, processor 11 loops back to retry the comparison. This occurs repeatedly until the comparison is successful or until expiration of a designated time interval. In the event the comparison does not succeed within the designated interval, the main processor signals a fault.

Figure 4:
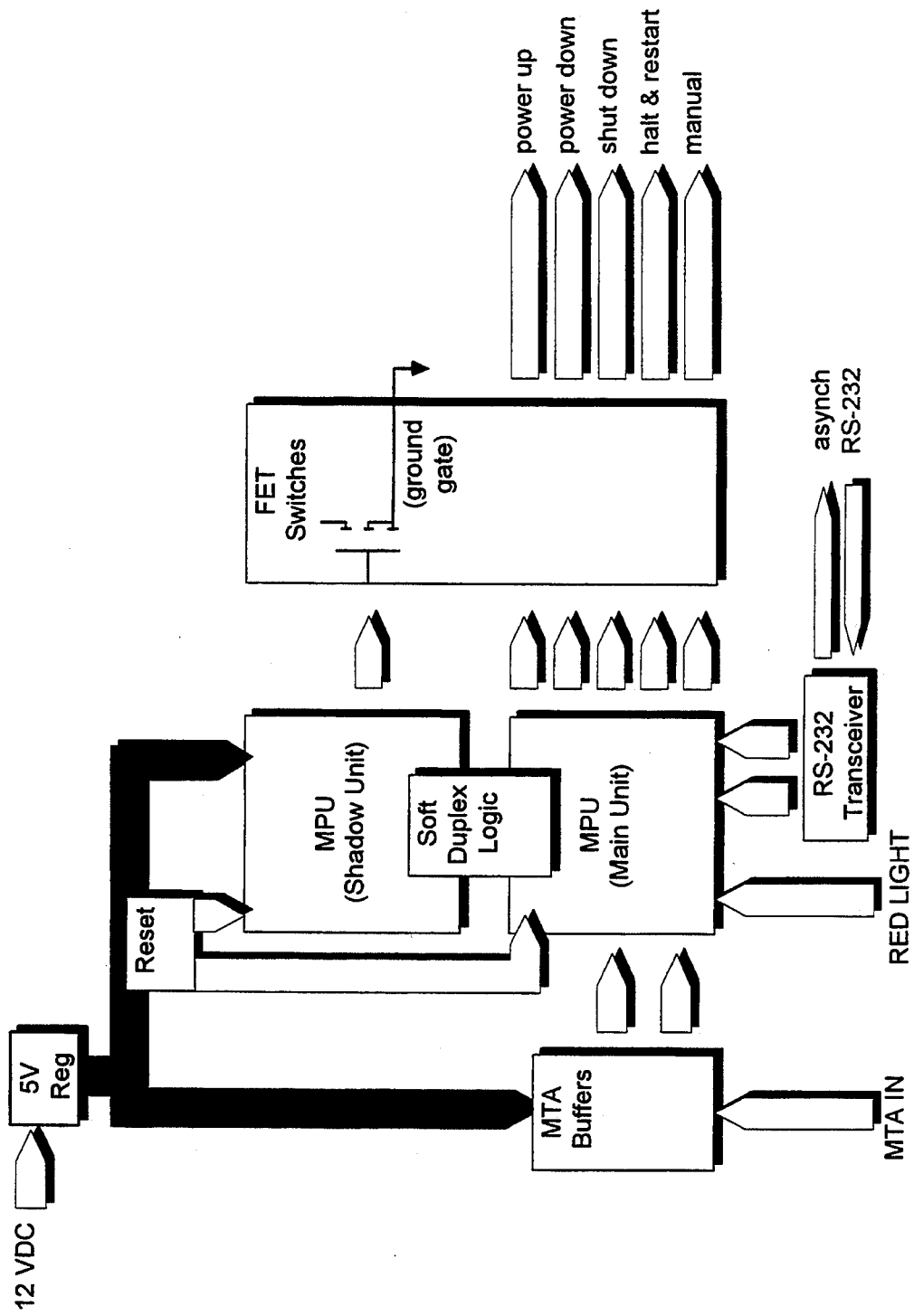
FIG. 4 depicts a computer module control panel constructed and operated in accord with a preferred practice of the invention.
Figure 5:
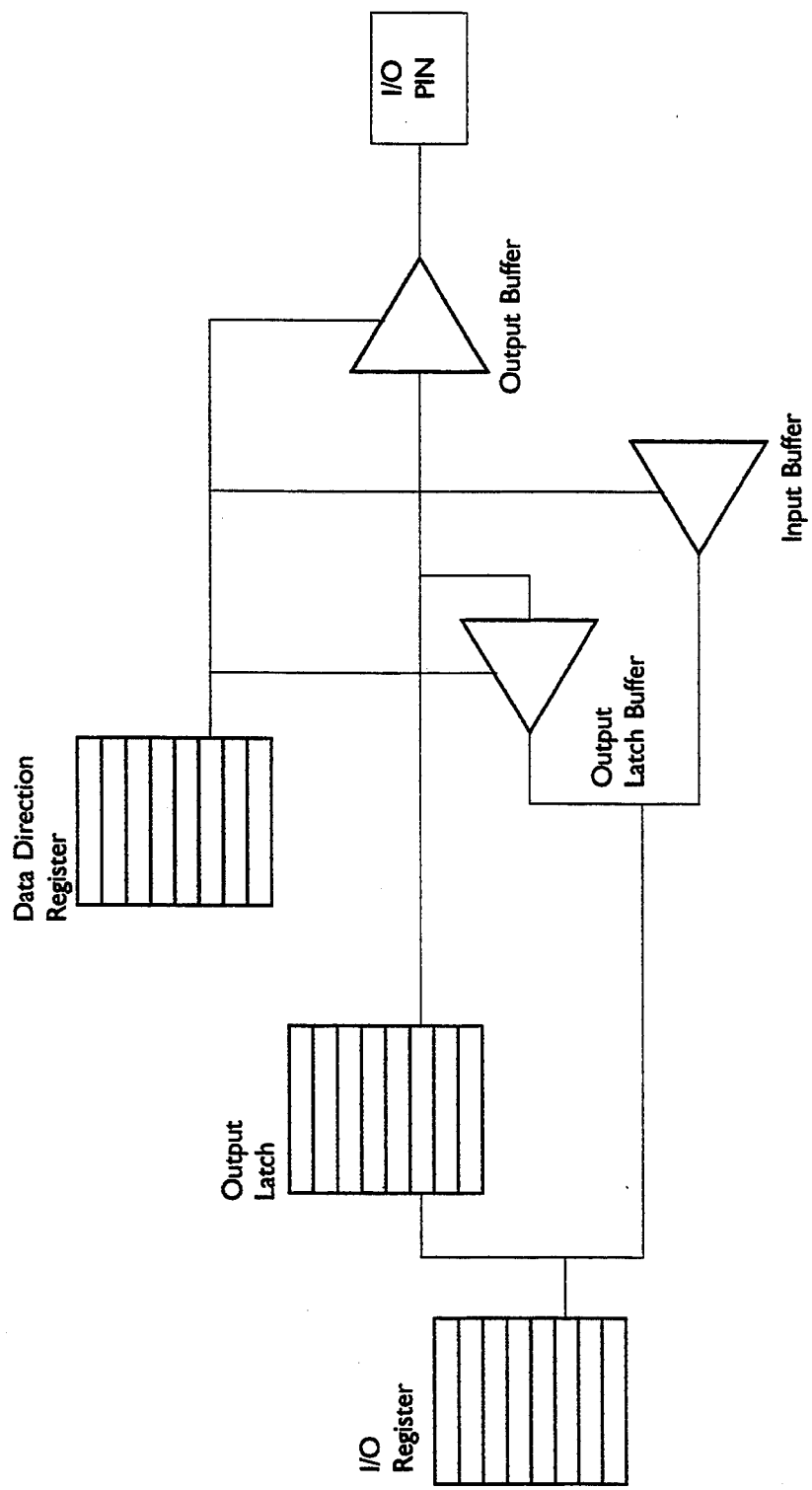
FIG. 5 depicts an input/output latch of a preferred microprocessor used to practice the invention.
Figure 6:
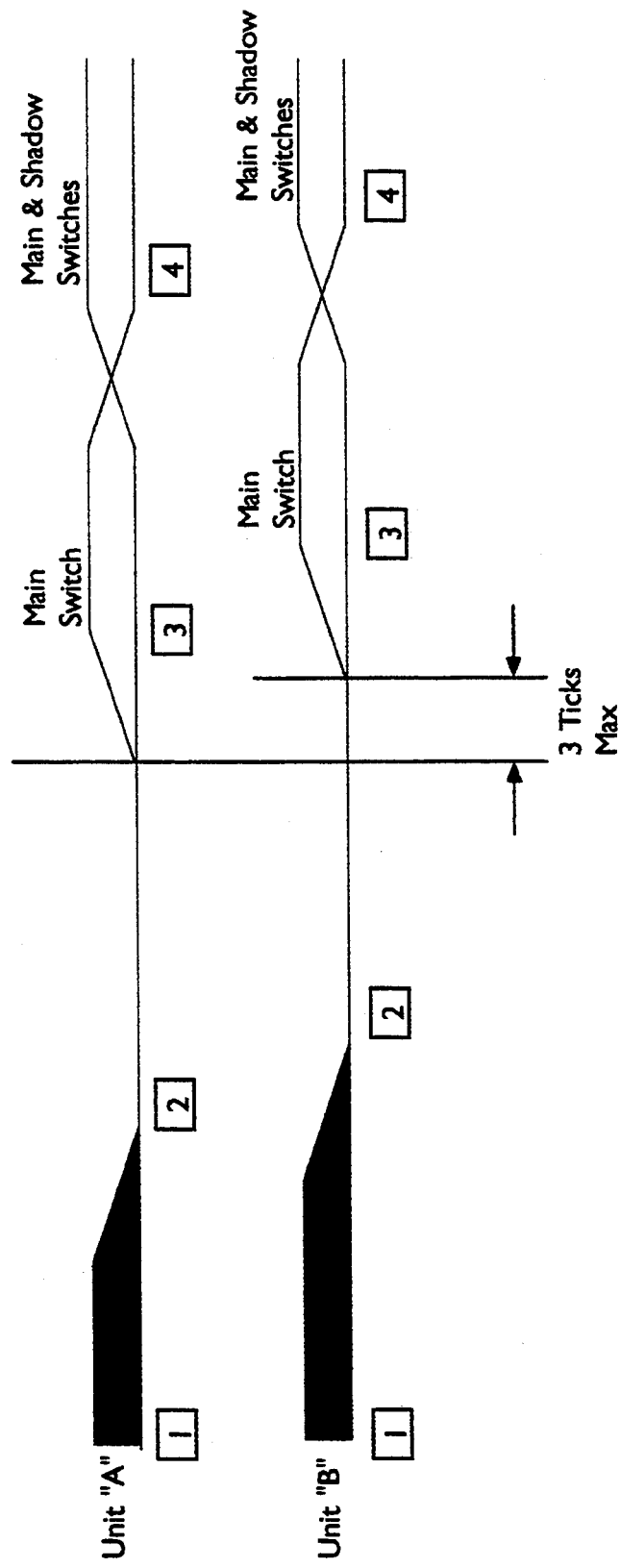
FIG. 6 is a timing sequence depicting operation of an apparatus according to the invention.

A still better understanding of the invention, and of a preferred practice thereof in a module control panel of a digital data processor, may be attained by reference to FIGS. 4–6 and to the discussion which follows.

1. Architecture

Illustrated control apparatus 10 allows automated control of arbitrary signals with or without human intervention. In doing so, it has the characteristic of not allowing erroneous data to be transmitted due to the occurrence of a random error in the controlling circuitry.

Fault detection in such an apparatus configured as a module control panel (hereinafter referred as the "MCP") according to the invention is based on the principle that a random error will virtually never occur in two identical, independent processing units (e.g., processors 11, 12) simultaneously, and that when such an error does occur, it will be detected through constant comparison of data (i.e., switching signals) generated by the units. In preferred embodiments of the invention, this detection of the incongruency is performed by the processing units 11, 12 themselves, as opposed to external comparitors.

Referring to FIG. 4, the MCP is intended to control or gate independently generated data from a source to a destination. Because the MCP cannot check the data stream itself, it attempts to prevent erroneous data from propagating across the lines. Thus, the MCP enforces fault-detection on two levels: hardware and software. The hardware functions as a signal generator and detector, controlling two batteries of switches and simultaneously reading the control signals from each battery. The software sets switch configuration, verifies that the two switch configurations are consistent, and brings the subsystem off-line if they aren't.

2. Hardware 2.1 Switch Control and Sensing

The MCP is capable of controlling one or more signals (e.g. DATA SIGNAL 1, DATA SIGNAL 2, ... DATA SIGNAL N). Those signals may originate from one or more distinct generators and may terminate at one or more distinct receivers. The purpose of MCP is to allow or disallow the transmission of the signals. The MCP is comprised of two halves, referred to as "main" (or "A") and "shadow" (or "B"). Each half consists of an independently running microcontroller (MCU) and a set of switches. The MCU's run independently in that each is driven by a separate clock and that there is no lock-stepping between the two: from a hardware perspective they are fully asynchronous. Each half manages two sets of lines: drivers for the switches, and receivers to monitor the drivers of the opposite unit.

In order for a signal to be received by its target device, both units must agree on an identical switch-enable configuration. This is implemented by each unit driving its battery of switches from one set of lines and by reading the drivers of the opposite unit to insure that both sets of drivers are the same. Either unit is able to detect a miscompare. Indeed, the asynchronous nature of the two processors is crucial in that if one ceases to operate due to clock failure, the other unit can detect it. In the event of a disagreement, two things happen: first, no signals are transmitted from source to destination because the necessary switch AND'ing is not present and, second, the MCU detecting the miscompare shuts off all its switches and permanently locks up.

2.2 Microcontroller Circuit

The MCU used for both the A and B side of the system includes a register of bits that is the same size as the number of signals that are to be controlled. It also includes an input port of bits to read the switch states as set by the opposite MCU. The microcontroller takes commands from an outside source, which can be a human operator or another machine, or from its own internal programming: for instance, in response to an internal timer that has matured. In order for the fault detecting mechanism to function, the two MCU's must be able to simultaneously and in a controlled manner throw the appropriate pair of switches across a signal line. It is in this operation that the two MCU's synchronize to each other, read each other's configuration, and decide to go or stop. All of this is performed in software.

2.3 Construction

Referring to FIG. 4, the illustrated MCP includes the following components:

- +12 VDC—This is the power supply to the unit, a regulated twelve volts. It may comprise a conventional commercially available twelve-volt power supply and, more preferably, a pair of wire-OR'd DC 12-volt bulk supplies.
- 5 V Reg—This is a local voltage supply of regulated 5V, direct currents. It may comprise a conventional commercially available voltage regulator and, more preferably, a monolithic chip and two filter capacitors.
- Reset—This is a low voltage detector that places the MCU's in a RESET state if the output from the five volt regulator decreases to a given threshold, e.g., 4.1 volts. This detector may be constructed in accord with well-known techniques for such devices and, more preferably, it may comprise a monolithic fixed threshold voltage detector.
- MTA Buffers—The Maintenance Termination Adapter (MTA) is an input-only interface that is used to transmit commands from the MTA to the panel. These commands will ultimately result in switch closure. Although a preferred MTA is a proprietary I/O board of AT&T, those skilled in the art will appreciate that any conventional circuitry may be used to transmit remote requests to the front panel.
- RED LIGHT—This is an input-only interface used by the central system to communicate messages from the main CPU to the front panel. It can also be used to send switch closure commands to the front panel.
- MPU (Shadow Unit)—This is one of the microcontroller units. It is named "shadow" because it controls the switching at the source side of the signal, sort of "at the ground . . . " It preferably comprises a Motorola 68HC705-C8 microcontroller, though other conventional programmable logic devices may be used.
- MPU (Main Unit)—This is one of the microcontroller units. It is named "main" because it controls the switches that are closest to the receiver of the signals. It preferably comprises a Motorola 68HC705-C8 microcontroller, though other conventional programmable logic devices may be used.
- RS-232 Transceiver—This is the bi-directional operator interface. Commands to start and stop the machine, and to set some state lines are received through this interface. Status from the machine is also transmitted from this interface. Any conventional RS-232 transceiver device can be used.
- FET Switches—The input/output pins of the MPU's are coupled to field effect transistors as described in detail below. The FET's themselves can be of conventional design and, preferably, are N-channel devices.

The MCU controls five signals: power up, power down, shutdown, halt & restart, and manual boot. The main MPU controls a switch for each signal for a total of five FET switches. The shadow MPU controls only one FET switch. This is preferred in order to conserve "real estate" on a printed circuit board in which the device can be implemented, and because the shadow switches require significant discrete component support. Couple this with the fact that the signal passed by all the switches is the same—hard ground—and the optimization is that there is only one shadow switch instead of five.

2.4 The Microcontroller

As indicated above, a preferred MPU is the Motorola 68HC705-C8. Among its features, its I/O architecture lends itself especially well to managing switch configuration. An appreciation of this may be attained by reference to FIG. 5, showing the configuration of an I/O bit of the 68HC705-C8.

As those skilled in the art will appreciate, the I/O Register (IOR) of the 68HC705-C8 is bi-directional and is read and written under program control. When written, the data is stored in Output Latch. The Data Direction Register (DDR) is write-only and sets the direction of an accompanying I/O register. There are four such registers in the 68HC705-C8. Each bit in the register is separately programmable to be input or output. Using bit 2 as an example, one may follow along with this description using FIG. 5. When the DDR bit is ON, the output driver is enabled, the output latch buffer is enabled, and the input buffer is disabled. Therefore, a bit written to the IOR is latched into the Output Latch and will be transmitted out the I/O pin and also looped back to the IOR to be programmatically read by the code. When the DDR bit is OFF, the output driver is disabled, the output latch buffer is disabled, and the input buffer is enabled. Therefore, a bit written to the IOR is latched into the Output Latch but is not passed through either the output latch buffer or the output driver. Instead, the signal at the I/O pin is transmitted through the input buffer to the IOR for the program to read.

Because the number of signals to be controlled by the main and shadow units is six instead often (two batteries of five switches), the preferred, illustrated embodiment uses one I/O port configured as 5-OUT, 1-IN for the main unit and 5-IN, 1-OUT for the shadow unit. In addition, the OUT bit positions for the main unit are the same as the IN bit positions in the shadow unit, and vice versa. This enables the programmer to write the same pattern out the switch port in either MCU and expect to read the same pattern. As it actually happened, the code in each MCU is identical, save for one instruction to load the DDR.

3. SOFTWARE

3.1. Synchronous Protocol

The synchronization protocol consists of a two-phase switch change. First, the main unit switches are changed and verified. The protocol allows for either the shadow or main units to enter the synchronization code first: there is looping built into the code to wait for main if it enters second. Second, the shadow unit switches are changed and verified. Again, there is looping code that holds off main if it arrives first. Each phase is time limited, so that if the looping continues for too long, it is assumed that the other unit is broken, and the waiting unit forces itself broken. In the process of breaking, all the switches are turned off and the MPU enter a tight, interrupt inhibited loop.

3.2 Synchronization Code
3.2.1 Upper Level Routine

What follows are excerpts of, and commentary on, software code for controlling the handling of halt & restart signal by the MPU's of a preferred MCU. Those skilled in the art will appreciate that the excerpted code may be readily adapted for the fault-tolerant generation of signals other than those for generating a "halt & restart" switch pattern.

This first section of code is one entry into the routine. It is used when the operator enters the Halt & Restart command from the front panel. It queries the operator to verify that, indeed, the machine is to be brought to a dead halt and restarted. It is not part of the synchronization protocol. This code section is identified as location "1" in the timing diagram of FIG. 6.

```
do_hr:  lda   #level7_query-msg.0   *Halt & Restart Request
        sta   yes.arg1
        jsr   get_yes
        lda   yes.arg1              *$FF in A-register if answer=yes
        beq   hr_done
```

The next section of code initiates the environment for synchronization. The call to "req_prolog" brings the two controllers to an all-switches-open state and disables any switch related event that may be pending. The synchronization process is implicitly dependent upon the two controllers having being in a switch-off/switch-off state. This code section is identified as location "2" in the timing diagram.

```
quiet_hr:
        jsr   req_prolog
```

The next three lines set a three second timer that will turn off the switches. After this routine closes the switches, they are then left closed until the timer matures, in effect emulating a three second physical switch closure by a human operator.

```
        lda   #THREE_SECS    *load the switch off timer
        sta   off.arg1
        jsr   set_short_off
```

The next two lines perform phase one of the synchronization protocol. At this point, the switches are in a known off/off state. The first instruction simultaneously sets the argument passed to "sync_up" and defines the desired switch configuration. This instruction is followed by a call to "sync_up", which will cause the Shadow processor to wait for the Main processor, if it arrives at this point before Main. When "sync_up" returns, the known state is that Main's switches are in the correct configuration while Shadow's switches remain off. Note that for the Shadow processor, it believes it has set the main switches, when in effect what it actually did was to set some internal latches and to read Main's external output lines. This code section is identified as location "3" in the timing diagram.

```
        bset  LEVEL7,syn.arg1    *assert CPU line
```

```
        jsr   sync_up
```

The next two lines perform phase two of the synchronization protocol. The first instruction simultaneously sets the argument passed to "sync_up" and defines the final switch configuration. This instruction is followed by a call to "sync_up", which will cause the Main processor to wait for the Shadow processor, if it arrives at this point before Shadow. Similar to the Shadow disposition in the previous paragraph, Main code believes it is setting the Shadow switch, when in effect what it is doing is setting an internal latch and reading the external value of Shadow's output line. When "sync_up" returns, the known state is that both Main and Shadow have turned on the correct switch pair. This code section is identified as location "4" in the timing diagram.

```
        bset  SHADOW,syn.arg1    *throw the safety
        jsr   sync_up
```

The next three lines are not part of the synchronization code. They are used to log the operation just completed.

```
        lda   #HST.LEV7
        sta   hst.arg1
        jsr   post_switch
```

Finally, the routine returns back to its caller.

```
hr_done:
        jmp   sw_done          *in 3 secs, unassert the line
```

In three seconds, the "set_short_off" event will mature, and a similar operation will take place to turn off the switches.

3.2.2 Lower Level Routines

It is not enough that both units turn on and turn off switches. Although this provides some form of protection that only the desired data will be passed from sender to receiver, the code thus far presented neither insures the switches are set coincidentally, nor that an error is dealt with appropriately. The subroutines "req_prolog" and "sync_up" perform these functions.

3.2.2.1 The Request Prolog

In order to bring switch management to a completely quiesced state, the code disables all events that might effect switch configuration and synchronize at a switch-clear state. This code section is nearly self explanatory. It stops each of three events. It guarantees that all switches are off by setting the argument to OFF and passing it in the synchronization routine (it doesn't matter whether they were, and could have been either on or off).

```
req_prolog:
        lda   #NM_SYN_ZR    *stop the sync_zero events
        sta   ena.arg1
        jsr   disable_event
        lda   #NM_LN_TIM    *stop the long_timer events
        sta   ena.arg1
        jsr   disable_event
        lda   #NM_SW_OFF    *stop the SWITCH_OFF events
```

-continued

```
    sta    ena.arg1
    jsr    disable_event
    clr    syn.arg1        *turn off switches, if not already
    jsr    sync_up         *insure both mpus are at zeros
rp_done:
    rts
```

3.2.2.2 The Synchronization Routine

The first operation performed in "sync_up" is to mask the processor from interrupts. During synchronization, it is assumed that the two processors are running the same code sequence. Interrupt processing will throw one of the processors out of the protocol for a significantly long period of time, and potentially cause a divergence of the two processors. The second instruction in this block is a check to determine whether synchronization has already been lost during this switch closure operation. If so, subsequent synchronization phases will not be able to complete; the code simply returns.

```
sync_up:
    sei                             *MASK all interrupts
    brset  SYNCF,config,sync_done   *punt if failure pending
```

The next instructions copy the requested switch configuration from the parameter variable and stores it in the switch output register, causing an immediate change in the FET switch configuration. At this time, the change is also readable by the other processor.

```
    lda    syn.arg1    *copy the requested switch config
    sta    switches    *into the switch port
```

By design, a synchronization phase shall not last indefinitely. The three instructions in this next block define the time allowed before synchronization is considered lost. The hex value $7000 is loaded into a RAM counter. This value defines the number of loops to be taken before entering a failure mode. In the case of this particular programming segment, the allocated hex $9000 loops will consume approximately one second.

```
    lda    #$70       *load in $7000 to count-up register
    sta    dly.hi     *to give us a count-up time of
    clr    dly.lo     *roughly one second
```

In the main portion of the waiting loop, the processor loads the switch image from the output register and compares this against the parameter value (LDA . . . CMP . . . ). If the two compare equal, synchronization has occurred and the subroutine returns (BEQ . . . ). Assuming that the compare failed, it will wait further and therefore must reset the processor watchdog timer, named "Computer Operating Properly" (COP) by the processor manufacturer. This hardware timer will reset the processor if it times out, roughly 65 milliseconds from last reset. The twenty-seven microseconds consumed by this subroutine is an important quantity in calculating the time-out value for this wait loop.

```
sync_wait:
    lda    switches    *what we got
    cmp    syn.arg1    *what we want
```

-continued

```
    beq    sync_done
    jsr    reset_cop   *don't do something ironic...
```

There are two failure modes defined for either phase. During phase one, Shadow is waiting for Main's new configuration, and will eventually fault if it doesn't find it. At the same time, Main is looking to see that Shadow has NOT set any switches; if so, Main will fault. If either faults, the controller as a unit will no longer allow signals to pass, and will enter a Red Light state. During phase two, the roles of the processors are reversed.

Assuming that the switches have yet to synchronize, the code continues to the next block. At this time it determines whether the one second time-out period has been reached. The first instruction increments the low order byte of the count-up variable. If the value does not transition from $FF to $00, the high order byte will not be effected by the increment, and the code returns back to the waiting point (BNE . . . ). If there is such a transition, the high order byte is incremented at the third instruction. In incrementing the high order byte, the code again looks for the $FF to $00 transition (BNE . . . ), indicating an overall transition from $FFFF to $0000. Upon reaching $0000, the code has consumed one second of waiting and must enter a failure mode.

```
    inc    dly.lo      *bump counter and check for overrun
    bne    sync_wait   *run the counter from $7000 to $FFFF
    inc    dly.hi      *when it reaches $0000, 2M cycles later
sync_chk:
    bne    sync_wait
```

If processing reaches the next block of instructions, the code has detected a synchronization failure. In addition to being caused by one processor performing an erroneous operation, this can also be due to the two processors receiving an asynchronous message and interpreting it slightly differently, as their clock phases are most certainly skewed. To avoid failing the subsystem due to a statistically occurring problem, the code uses a threshold mechanism to determine if it should bring the subsystem off line. The first instructions reads the count of failures to synchronize. The second instructions compares this value to a fixed threshold (three). The third instruction branches to code that will effectively kill this processing unit.

```
    lda    sync.fail   *get the failure count
    cmp    #3          *too many failures have occurred,
    bpl    sync_die    *so die
```

This next section of code is reached when the error threshold has not been reached and it is able to ride through the lost synchronization. It first clears the switches and their local image, preventing ourselves from further malfunctions. It then sets a flag telling other parts of the code that synchronization has failed (BSET . . . ). Finally, it exits.

```
    clr    switches       *don't let anything happen
    clr    syn.arg1
    bset   SYNCF,config   *message for sw_done
    bra    sync_done
```

The next section of code is arrived at if the error threshold is exceeded. At this point, it simply sets the failure reason (LDA), unmask interrupts (CLI), and induce a fault with the "SWI" instruction.

```
sync_die:
    lda     #ERR.SYN
    cli                 *UNMASK
    swi                 *die
```

At the end of the subroutine, a subtle timing condition occurs. Initially assume that the only instruction in this code section is the return from subroutine. Given this assumption, there is a race condition as follows. Let Shadow arrive at "quiet_hr" first. Shadow executes the setup code, sets the internal LEVEL 7 bit, and jumps into "sync_up". Let Main arrive at "quiet_hr" several microseconds after Shadow. While Shadow is executing Sync_up, Main is setting the actual external LEVEL 7 switch. As Shadow exits "reset_cop", it checks the switches for LEVEL 7, sees it, and immediately branches to "sync_done" which, for the sake of this argument, quickly returns. The next instruction that Shadow will execute sets the external SHADOW switch. Meanwhile, Main enters the "sync_up" subroutine, spends twenty-seven microseconds resetting the COP, and looks at the switches only to find that SHADOW is unexpectedly on. Although Shadow is abiding by the protocol, Main will go broken. The solution is to slow down the first processor coming out of "sync_up". This is done by delaying the unit for at least as many clock periods as "sync_up" takes to execute. One call to "req_dly" (request delay) conveniently satisfies this need. Before returning to the caller, it unmasks and permits interrupts to occur.

```
sync_done:
    jsr     req_dly
    cli                 *UNMASK
    rts
```

3.2.3 Timing Chart

The timing chart of FIG. 6 provides a graphic representation of the explanation in section 3.2.2. Although it is best to refer back to section 3.2.2, here is a summary of the flow:

1. Interactive prologue, switches in undefined state,
2. Begin synchronization proper, close all switches,
3. Main closes switches, shadow tests for switches
4. Shadow closes switches, main tests for switches.

Note that the units have not been labeled "main" and "shadow". This is because it is neither predictable nor important which unit first commences the protocol. For the illustration, Unit A arrives first and Unit B arrives second.

Conclusion

Described above is an improved fault-tolerant control apparatus meeting the objects set forth. Those skilled in the art will appreciate, of course, that the embodiments described herein are exemplary and that other embodiments incorporating modifications thereto are contemplated to fall within the scope of the invention.

In view of the foregoing, what we claim is:

1. A method for operating a digital data processing apparatus the improvement for fault-tolerant actuation of a functional unit in response to an actuation request, comprising the steps of
   A. providing the functional unit with a switching section that responds to application of plural switching signals for activating the functional unit,
   B. providing first and second processing elements, each normally responding to an actuation request for generating a first set of switching signals, said first set of switching signals including at least one, but not all, of said plural switching signals,
   C. outputting the first set of switching signals generated by the first processing element for application to said switching section,
   D). synchronizing said first and second processing elements by comparing, with said second processing element, the first set of switching signals generated thereby with those output by said first processing element,
   E. generating, after synchronization, with each of said first and second processing elements, a second set of switching signals, said second set of switching signals including at least one, but not all, of said plural switching signals, said first and second subsets of switching signals together making up said plural switching signals, and
   F. outputting the second set of switching signals generated by the second processing element for application to said switching section.

2. A fault-tolerant method for transferring information signals on a signal transfer bus in response to an actuation request, comprising the steps of
   A. providing said data transfer bus with a switching section responsive to plural switching signals for gatably transferring said data signals on that signal transfer bus,
   B. providing first and second processing elements, each normally responding to said actuation request for generating a first set of switching signals, said first set of switching signals including at least one, but not all, of said plural switching signals,
   C. outputting the first set of switching signals generated by said first processing element for application to said switching section,
   D. synchronizing said first and second processing elements by comparing, with said second processing element, the first set of switching signals generated thereby with those output by said first processing element,
   E. generating, after synchronization, with each of said first and second processing elements, a second set of switching signals, said second set of switching signals including at least one, but not all, of said plural switching signals, said first and second subsets of switching signals together making up said plural switching signals, and
   F. outputting the second set of switching signals generated by said second processing element for application to said switching section.

3. A fault-tolerant method for selectively applying at least one of plural control signals to an apparatus in response to an actuation request, comprising the steps of
   A. providing a signal transfer bus capable of transferring said plural control signals to said apparatus, said signal transfer bus including a switching section for gatably transferring a selected control signal to said apparatus in response to plural respective switching signals associated with that control signal, B. providing first and second processing elements, each normally responding to an actuation request for generating a first set of switching signals, said first set of switching signals including at least one, but not all, of the plural switching signals associated with a control signal associated with that actuation request, C. outputting the first set of switching signals generated by said first processing element for application to said switching section, D. synchronizing said first and second processing elements by comparing, with said second processing element, the first set of switching signals generated thereby with those output by said first processing element, E. generating, after synchronization, with each of said first and second processing elements, a second set of switching signals, said second set of switching signals including at least one, but not all, of said plural switching signals associated with the control signal associated with that actuation request, said first and second subsets of switching signals together making up the plural switching signals associated with that actuation request, and F. outputting the second set of switching signals generated by said second processing element for application to said switching section.

4. A method according to any of claims 1–3, the further improvement comprising the step of resynchronizing said first and second processing elements by comparing, with said first processing element, the second set of switching signals generated thereby with those output by said second processing element.

5. A method according to claim 4, the further improvement wherein at least one of said synchronizing and resynchronizing steps comprise the step of generating a fault signal indicative of at least selected miscomparison of the compared switching signals.

6. A method according to claim 5, the further improvement comprising the step of responding to said fault signal for inhibiting at least the second outputting step.

7. A method according to any of claims 1–3, the further improvement wherein
A. said providing step includes the step of providing, as each said first and second processing elements, a programmable logic element capable of executing a sequence of instructions,
B. said synchronizing step includes the step of executing on the programmable logic elements of each of said first and second processing elements substantially identical sequences of instructions.

8. A method according to any of claims 1–3, the further improvement wherein
A. said first outputting step includes the step of outputting only the first set of switching signals generated by said first processing element for application to said switching section, and
B. said second outputting step includes the step of outputting only the second set of switching signals generated by said first processing element for application to said switching section.

9. A method according to claim 8, the further improvement wherein
A. said providing step includes the step of providing, as each said first and second processing elements, a programmable logic element for executing a sequence of instructions, and
B. said providing step further includes providing said first processing element with an output latch that is enabled to output said first set of switching signals, but is disabled from outputting said second set of switching signals,
C. said providing step Further includes providing said second processing elements with an output latch that is disabled from outputting said first set of switching signals, but is enabled to output said second set of switching signals, and
D. each said outputting steps includes the step of executing on the programmable logic elements of each of said first and second processing elements substantially identical sequences of instructions that would otherwise result in each of those programmable logic elements outputting a respective set of switching signals.

10. A method according to any of claims 1–3, the further improvement wherein
A. said providing steps includes the step of providing, as said first and second processing elements, asynchronous processing elements, and
B. driving each of asynchronous said first and second processing elements with an independent clocking signal.

11. In a digital data processing apparatus, the improvement for fault-tolerant actuation of a functional unit in response to an actuation request comprising
A. switching section means, coupled to said functional unit, for responding to application of plural switching signals for activating that functional unit,
B. first and second processing means, coupled to said switching section means, each processing means for normally responding to an actuation request for generating a first set of switching signals, said first set of switching signals including at least one, but not all, of said plural switching signals,
C. said first processing means including means for outputting the first set of switching signals for application to said switching section means,
D. said second processing means including synchronizing means for comparing the first set of switching signals generated by said second processing means with those output by said first processing means,
E. said first and second processing means further including means tier generating a second set of switching signals, said second set of switching signals including at least one, but not all, of said plural switching signals, said first and second subsets of switching signals together making up said plural switching signals, and
F. said second processing means includes means for outputting the second set of switching signals for application to said switching section means.

12. An apparatus for transferring information signals on a signal transfer bus in response to an actuation request, the improvement comprising
A. switching section means, coupled to said signal transfer bus, for responding to application of plural switching signals for gatably transferring said information signals on that bus,
B. first and second processing means, coupled to said switching section means, each processing means for normally responding to an actuation request for generating a first set of switching signals, said first set of switching signals including at least one, but not all, of said plural switching signals, C. said first processing means including means for outputting the first set of switching signals for application to said switching section means,
D. said second processing means including synchronizing means for comparing the first set of switching signals generated by said second processing means with those output by said first processing means,
E. said first and second processing means further including means for generating a second set of switching signals, said second set of switching signals including at least one, but not all, of said plural switching signals, said first and second subsets of switching signals together making up said plural switching signals, and
F. said second processing means includes means for outputting the second set of switching signals for application to said switching section means.

13. Fault-tolerant circuitry for selectively applying at least one of plural control signals to an apparatus in response to an actuation request, comprising A. signal transfer bus capable of transferring said plural control signals to said apparatus, said signal transfer bus including a switching section for gatably transferring a selected control signal to said apparatus in response to plural respective switching signals associated with that control signal,
B. first and second processing means, coupled to said switching section means, each processing means for normally responding to an actuation request for generating a first set of switching signals, said first set of switching signals including at least one, but not all, of said plural switching signals associated with a control signal associated with that actuation request,
C. said first processing means including means for outputting the first set of switching signals for application to said switching section means,
D. said second processing means including synchronizing means for comparing the first set of switching signals generated by said second processing means with those output by said first processing means,
E. said first and second processing means further including means for generating a second set of switching signals, said second set of switching signals including at least one, but not all, of said plural switching signals, said first and second subsets of switching signals together making up said plural switching signals, and
F. said second processing means includes means for outputting the second set of switching signals for application to said switching section means.

* * * * *